United States Patent [19]

Koizumi et al.

[11] Patent Number: 4,917,988
[45] Date of Patent: Apr. 17, 1990

[54] PROCESS FOR PRODUCING PHOTOSENSITIVE NEGATIVE WORKING DIAZO RESIN LITHOGRAPHIC PLATE USING ADMIXTURE OF AT LEAST THREE SOLVENTS

[75] Inventors: Shigeo Koizumi; Nobuo Nishikawa; Nobuyuki Kita, all of Shizuoka, Japan

[73] Assignee: Fuji Photo Film Co., Ltd., Minami-ashigara, Japan

[21] Appl. No.: 156,801

[22] Filed: Feb. 17, 1988

[30] Foreign Application Priority Data

Apr. 16, 1987 [JP] Japan .................................. 62-93498

[51] Int. Cl.$^4$ .......................... G03C 1/74; G03F 7/16; G03F 7/08
[52] U.S. Cl. .................................... 430/169; 430/175; 430/177; 430/302
[58] Field of Search ................ 430/175, 169, 177, 302

[56] References Cited

U.S. PATENT DOCUMENTS

| | | | |
|---|---|---|---|
| 3,890,152 | 6/1975 | Ruckert et al. | 430/175 |
| 4,421,841 | 12/1983 | Shimizu et al. | 430/302 |
| 4,552,908 | 11/1985 | Nicks et al. | 523/504 |
| 4,657,942 | 4/1987 | Iwasaki et al. | 522/16 |
| 4,659,645 | 4/1987 | Frommeld et al. | 430/175 |
| 4,764,450 | 8/1988 | Ruckert et al. | 430/191 |

FOREIGN PATENT DOCUMENTS 211667  2/1987  European Pat. Off. ............ 430/191

*Primary Examiner*—Charles L. Bowers, Jr.
*Attorney, Agent, or Firm*—Burns, Doane, Swecker & Mathis

[57] ABSTRACT

A process for producing a photosensitive lithographic plate comprises coating onto a substrate having a hydrophilic surface a solution of a negative working photosensitive composition containing a photosensitive diazo resin and a linear organic polymer dissolved in a solvent mixture comprising:

(a) at least 10 wt. % of 1-methoxy-2-propanol,
(b) an amino group-free polar solvent having a boiling point under 1 atm of 50° to 100° C. and a dielectric constant at 20° C. of at least 5.5, and
(c) 2 to 50 wt. % of methyl lactate, and drying the coated solution.

14 Claims, No Drawings

PROCESS FOR PRODUCING PHOTOSENSITIVE NEGATIVE WORKING DIAZO RESIN LITHOGRAPHIC PLATE USING ADMIXTURE OF AT LEAST THREE SOLVENTS

BACKGROUND OF THE INVENTION

1. Field of the Invention

The present invention relates to a process for producing a photosensitive lithographic plate. In particular, the present invention relates to a process for producing a photosensitive lithographic plate wherein a negative working photosensitive composition is applied to a substrate by using a special solvent.

2. Description of the Prior Art

A process for producing a photosensitive lithographic plate by applying a photosensitive composition comprising a photosensitive diazonium salt and a linear organic polymeric compound to a substrate having a hydrophilic surface has been well known.

However, a photosensitive lithographic plate produced by applying a solution of the photosensitive composition to the substrate having the hydrophilic surface, particularly an aluminum plate, the surface of which is made hydrophilic by a treatment, has the defect that the developability thereof is reduced with time and a non-image area is stained in the printing step.

Various processes have been proposed for overcoming this defect. For example, Japanese Patent Unexamined Published Application (hereinafter referred to as "J. P. KOKAI") No. 62-38471, which corresponds to U.S. patent application, Ser. No. 06/896,025 filed on Aug. 13, 1986, discloses a photosensitive composition containing a photosensitive diazo resin and a polymeric compound wherein at least 10 wt.% of a solvent used is 1-methoxy-2-propanol so as to inhibit the reduction of developability with time.

In the production of the lithographic plates on an industrial scale, a photosensitive resin coating solution is continuously applied to a substrate conveyed in the form of a belt, then the coated substrate is dried to form a thin film having a uniform thickness. Therefore, optimum concentration and viscosity are required of the photosensitive resin coating solution. A coating solution containing a large amount of a solvent having a boiling point of as high as 100° C. or higher is not preferred, since it requires a long, complicated drying device. A solvent having a boiling point of lower than 50° C. is dangerous, since it easily ignites or explodes. Further, such a solvent is rapidly evaporated in the drying step, making the photosensitive layer uneven. It is preferred, therefore, to use a mixture of a low-boiling solvent having a boiling point of 50° to 100° C. and a high-boiling solvent having a boiling point of higher than 100° C.

However, in a photosensitive composition in which the solvent comprises 1-methoxy-2-propanol containing at least 20 wt.% of such a low boiling solvent, the compatibility between the photosensitive diazo resin and the linear organic polymer is poor and sufficient printing durability cannot be obtained.

SUMMARY OF THE INVENTION

Accordingly, an object of the present invention is to provide a photosensitive lithographic plate produced by applying a photosensitive resin coating solution containing a linear organic polymer and a photosensitive diazo resin to a substrate and drying it, which plate is substantially free from staining with a lapse of time and has excellent printing durability.

Another object of the present invention is to provide a process for producing the photosensitive lithographic plate wherein a photosensitive resin coating solution applied to a substrate can be dried in a short time to obtain the intended photosensitive lithographic plate.

Still another object of the present invention is to provide a process for producing the photosensitive lithographic plate wherein a photosensitive resin coating solution applied to a substrate can be dried with a simple device to obtain the intended photosensitive lithographic plate.

After intensive investigations made for the purpose of attaining the above-mentioned objects, the inventors have found that a photosensitive lithographic plate produced by dissolving a photosensitive resin in a mixture of special solvents, applying the solution to a substrate having a hydrophilic surface and drying it satisfies the abovementioned objects.

The present invention provides a process for producing a photosensitive lithographic plate, which comprises coating onto a substrate having a hydrophilic surface a solution of a negative working photosensitive composition containing a photosensitive diazo resin and a linear organic polymer dissolved in a solvent mixture comprising:

(a) at least 10 wt.% of 1-methoxy-2-propanol,
(b) an amino group-free polar solvent having a boiling point under 1 atm of 50° to 100° C. and a dielectric constant at 20° C. of at least 5.5, and
(c) 2 to 50 wt.% of methyl lactate,
and drying the coated solution.

DESCRIPTION OF THE PREFERRED EMBODIMENTS

The amount of the component (a), 1-methoxy-2-propanol, is at least 10 wt.%, preferably 10 to 90 wt.%, and more preferably 20 to 70 wt.%, based on the total solvent mixture used in the present invention.

The polar solvent (b) having a boiling point of 50 to 100° C. used in the present invention must be thoroughly miscible with 1-methoxy-2-propanol which is the principal component of the solvent composition of the photosensitive resin coating solution. It is also important that the solvent (b) does not inhibit the dissolution of the photosensitive diazo resin. These conditions are satisfied when a polar solvent having a dielectric constant of at least 5.5 is selected.

However, when an amino group-having basic solvent among these polar solvents is used, the photosensitive diazo resin is decomposed, and when a photosensitive resin coating solution thus obtained is used, the resulting lithographic plate does not satisfy the required conditions.

The solvents satisfying the above-mentioned conditions include, for example, halogenated hydrocarbons such as 1,2-dichloroethane, 1,1-dichloroethane, 1,1,1-trichloroethane, cis-1,2-dichloroethylene, 1,2-dichloropropane, butyl chloride and chlorobromomethane; aliphatic alcohols such as methanol, ethanol, n-propanol, isopropanol, sec-butyl alcohol and tertbutyl alcohol; ethers and ketones such as tetrahydrofuran, tetrahydropyran, ethylene glycol dimethyl ether, acetone and methyl ethyl ketone; and esters such as ethyl formate, propyl formate, isobutyl formate, methyl acetate, ethyl acetate, isopropyl acetate, methyl propionate and ethyl propionate.

These solvents are used either singly or as a mixture of two or more kinds thereof. Although the amount of the solvent (b) is not particularly limited, it is usually 5 to 70 wt.%, preferably 10 to 50 wt.%.

The characteristic feature of the present invention resides in the addition of 2 to 50 wt.% of methyl lactate to these solvents. The amount of methyl lactate is more preferably 5 to 30 wt.%.

When the amount f methyl lactate is less than 2 wt.%, the intended effect thereof of improving the printing durability cannot be obtained, while if it exceeds 50 wt.%, a long time and a high energy are necessitated for drying the photosensitive resin coating solution on the substrate, since its boiling point is 144.8° C.

A very small amount of a higher-boiling solvent having a boiling point higher than that of methyl lactate can be added to the photosensitive resin coating solution in order to increase the solubility of the photosensitive diazo resin. The higher-boiling solvents include, for example, dimethyl sulfoxide, diethylene glycol monomethyl ether, diethylene glycol monomethyl ether acetate, diethylene glycol monoethyl ether, diethylene glycol dimethyl ether, diethylene glycol, triethylene glycol monomethyl ether, triethylene glycol, ethylene glycol monophenyl ether, trimethyl phosphate, triethyl phosphate, ethylene carbonate, γ-butyrolactone, γ-valerolactone, diacetone alcohol, methyl acetoacetate and tetrahydrofurfuryl alcohol.

The amount of the higher-boiling solvent is less than 2 wt.%, preferably 0.05 to 1.5 wt.% and more preferably 0.2 to 1 wt.%, based on the total solvent composition.

The linear organic polymer may be any of those photocurable by, for example, a crosslinking reaction with the photosensitive diazo resin. Usually it is preferred that a printing plate produced by applying a photosensitive resin coating solution to a suitable substrate is developable with an aqueous alkali solution so as not to pollute the environment with wasted developing solution. Accordingly, the linear organic polymeric compound can be preferably dissolved or swollen in the developer comprising the aqueous alkali solution.

Suitable linear organic polymers include copolymers comprising acrylic acid, methacrylic acid, crotonic acid or maleic acid as a mandatory component such as copolymers of 2-hydroxyethyl acrylate or 2-hydroxyethyl methacrylate; acrylonitrile or methacrylonitrile; acrylic acid or methacrylic acid; and optional other copolymerizable monomers as described in U.S. Pat. No. 4,123,276; copolymers of acrylic acid or methacrylic acid having a terminal hydroxyl group and esterified with a group containing a residue of dicarboxylic acid ester, acrylic acid or methacrylic acid and optional other copolymerizable monomers as described in J. P. KOKAI No. 53-120903; copolymers of monomers having a terminal aromatic hydroxyl group (such as N-(4-hydroxyphenyl)methacrylamide), acrylic acid or methacrylic acid and optional other copolymerizable monomers as described in J. P. KOKAI No. 54-98614; and copolymers of alkyl acrylates, acrylonitrile or methacrylonitrile and unsaturated carboxylic acids as described in J.P. KOKAI No. 56-4144. Further, acidic polyvinyl alcohol derivatives and acidic cellulose derivatives are also usable. In addition, polyvinyl acetals modified to an alkali-soluble form as described in British Patent No. 1,370,316 are also usable.

The photosensitive diazo resins usable in the present invention include those described in U.S. Pat. Nos. 3,867,147 and 2,632,703. Among them, diazo resins such as a condensate of an aromatic diazonium salt and, for example, an active carbonyl-having compound, e.g. formaldehyde, are particularly useful. The preferred diazo resins include, for example, hexafluorophosphates, tetrafluoroborates and phosphates of a condensate of p-diazophenylamine and formaldehyde or acetaldehyde. The preferred ones further include sulfonates (such as p-toluenesulfonate and 2-methoxy4-hydroxy-5-benzoylbenzenesulfonate), phosphinates (such as benzenephosphinate), hydroxyl group-having salts (such as 2,4-dihydroxybenzophenone salt) and organic carboxylic acid salts of a condensate of p-diazodiphenylamine and formaldehyde.

The preferred photosensitive diazo resins include, in addition, those produced by condensing 3-methoxy-4-diazodiphenylamine with 4,4'-bismethoxymethyldiphenyl ether and converting the condensate into its mesitylenesulfonate as described in J.P. KOKAI No. 58-27141.

The amounts of the photosensitive diazo resin and the linear organic polymer in the photosensitive film are 3 to 30 wt.% and 97 to 70 wt.%, respectively, based on their total. The lower the diazo resin content, the higher the sensitivity. However, when the diazo resin content is lower than 3 wt.%, the photo-curing of the polymer is insufficient, and as a result, the photo-cured film is swollen by the developer and becomes weak. On the other hand, when the diazo resin content exceeds 30 wt.%, the sensitivity is reduced, causing trouble in practice. Therefore, the more preferable ranges of the diazo resin and polymer are 5 to 20 wt.% and 95 to 80 wt.%, respectively.

Various additives can be added to the photosensitive composition used in the present invention. These include, for example, alkyl ethers (such as ethylcellulose and methylcellulose) and fluorine-containing surfactants for improving the coating properties; plasticizers for imparting flexibility and abrasion resistance to the coating film (such as tricresyl phosphate, dimethyl phthalate, dibutyl phthalate, trioctyl phosphate, tributyl phosphate, tributyl citrate, polyethylene glycol and polypropylene glycol); colorants such as acridine dyes, cyanine dyes, styryl dyes, triphenylmethane dyes and phthalocyanine pigments for visualizing the image area after development; and ordinary stabilizers for the diazo resin (such as phosphoric acid, phosphorous acid, pyrophosphoric acid, oxalic acid, boric acid, toluenesulfonic acid, polymers and copolymers of acrylic acid, polymers and copolymers of vinylphosphonic acid, polymers and copolymers of vinylsulfonic acid, 5-nitronaphthalene-1-phosphonic acid, 4-chlorophenoxymethylphosphonic acid, sodium phenylmethylpyrazolone sulfonate, 2-phosphonobutanetricarboxylic acid-1,2,4, 1-phosphonoethanetricarboxylic acid-1,2,2 and 1-hydroxyethane-1,1-disulfonic acid). Although the amount of these additives varies depending on the object, it is usually 0.5 to 30 wt.% based on the total solid content of the photosensitive layer.

The substrate to which the photosensitive composition of the present invention is to be applied is a plate having a high dimensional stability. Dimensionally stable plates include those ordinarily used as substrates of printing plates. These are suitable for the use in the present invention, and include, for example, paper; paper and aluminum (including aluminum alloys) laminated with a plastic (such as polyethylene, polypropylene or polystyrene); metal plates such as zinc and copper plates; plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films; and papers and plastic films laminated with the above-mentioned metals or on which these metals are vapor-deposited. Among these substrates, the aluminum plates are particularly preferred, since they are dimensionally quite stable and inexpensive.

Among aluminum plates, those having a roughened surface are particularly preferred, and can be produced by various methods. The surface of the aluminum plate is roughened by, for example, a wire brush graining method, a brush graining method in which the surface is roughened with a nylon brush while a slurry of abrasive grains is poured thereon, a ball graining method, a chemical graining method, an electrolytic graining method, and a combined graining method in which a combination of these methods is employed. The plates preferably are then, if necessary, subjected to anodic oxidation in sulfuric acid, phosphoric acid, oxalic acid, boric acid, chromic acid, sulfamic acid or a mixture of these acids using a direct or alternating current power source to form a firm film in a passive state on the aluminum surface. Although the aluminum surface is made hydrophilic by forming such a film in a passive state, it is particularly preferred to subject it to a further treatment with a silicate (such as sodium silicate or potassium silicate) as described in U.S. Pat. Nos. 2,714,066 and 3,81,461, treatment with potassium fluorozirconate as described in U.S. Pat. No. 2,946,638, treatment with a phosphomolybdate as described in U.S. Pat. No. 3,201,247, treatment with polyacrylic acid as described in West German Patent No. 1,091,433, treatment with polyvinyl phosphonic acid as described in West German Patent No. 1,134,093 and British Patent No. 1,230,447, treatment with phosphonic acid as described in J.P. KOKAI No. 44-6409, treatment with phytic acid as described in U.S. Pat. No. 3,307,951, treatment with a hydrophilic organic polymer and a divalent metal as described in J.P. KOKAI Nos. 58-16893 and 58-18291, and treatment with a water-soluble polymer having a sulfonic acid group to form a priming layer, if necessary. Further, the substrate can be made hydrophilic also by electrodeposition of a silicate as described in U.S. Pat. No. 3,658,662.

The amount of the photosensitive composition to be applied to the hydrophilic surface of the substrate in the present invention is preferably 0.3 to 5 g/m², more preferably 0.5 to 3.5 g/m², in terms of solids. The solid concentration of the photosensitive composition having a coating property suitable therefor is 1 to 50 wt.%, preferably 2 to 20 wt.%. A solution of the photosensitive composition is applied to the hydrophilic substrate by a known method such as roll coating, bar coating, spray coating, curtain coating or rotary coating. The solution of the photosensitive composition thus coated is dried preferably at 50 to 120° C. It can be predried at a low temperature and then dried at a high temperature or, alternatively, it can be directly dried at a high temperature.

The presensitized lithographic plate having the photosensitive composition layer thus formed by applying the composition to the hydrophilic surface of the substrate and then drying it is imagewise exposed to an actinic light and then developed with a developer comprising an aqueous alkali solution to form a negative relief image of the original. The light sources suitable for the exposure include, for example, carbon arc lamps, mercury lamps, xenon lamps, metal halide lamps, stroboscopes, ultraviolet rays and laser beams. The "aqueous alkali developer" used for developing the lithographic printing plate prepared in accordance with the present invention refers to one which contains an alkali agent, e.g., triethanolamine, monoethanolamine, etc., which have pHs in the range of from 8 to 13 and which contain at least 75 wt.% water. The aqueous alkali developer may contain a small amount of an organic solvent, a surfactant, an anti smudge agent, or a water softener as required. An illustrative aqueous alkali developer is a weak alkaline aqueous solution as described in J.P. KOKAI Nos. 51-77401, 51-80228, 53-44202 corresponding to U.S. Pat. Nos. 4,186,006, and 55-52054, which is composed of an organic solvent having a water solubility of not more than 10% at room temperature (e.g., benzyl alcohol or ethylene glycol monophenyl ether), an alkali agent (e.g., triethanolamine or monoethanolamine), an anionic surfactant (e.g., an aromatic sulfonate, dialkylsulfosuccinate, alkylnaphthalenesulfonate,

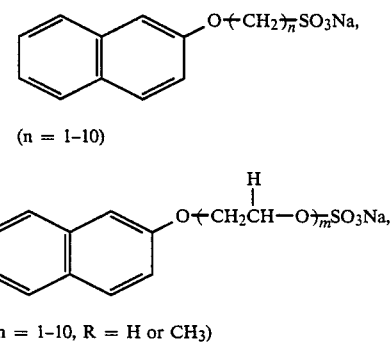

(n = 1-10)

(m = 1-10, R = H or CH₃)

or a branched alkyl sulfate ester), and water, with an optional anti-smudge agent (e.g., sodium sulfite or a sodium salt of sulfopyrazolone) or water softener (e.g., tetrasodium ethylenediaminetetraacetate or N(CH₂COONa)₃).

From the foregoing description, it will be understood that when the photosensitive lithographic plate produced by the process of the present invention is used, the problem of the staining of the non-image area of the plate can be solved and the printing durability is remarkably improved.

The following examples will further illustrate the present invention, in which the percentages given are by weight.

EXAMPLE 1

A 2S aluminum plate having a thickness of 0.24 mm was decreased by immersing it for 3 min. in a 10% aqueous trisodium phosphate solution kept at 80° C. The plate surface was then roughened by the brush graining method. After desmutting with a 3% aqueous sodium aluminate solution at 60° C, the aluminum plate was subjected to anodic oxidation in 20% sulfuric acid solution at a current density of 2 A/dm² for 2 min. and then treated in 3% aqueous potassium silicate solution at 70° C. for 1 min.

The following photosensitive composition solution (1) was applied to the aluminum substrate thus prepared with a whirler and then dried at 100° C. for 2 min. The coating rate was controlled to provide a coating of 1.5±0.1 g after drying.

| Solution of photosensitive composition (1) | |
|---|---|
| Copolymer (1) | 5.0 g |
| Diazo resin (1) | 0.5 g |
| Victoria Pure Blue BOH | 0.15 g |
| Sodium t-butylnaphthalenesulfonate | 0.15 g |
| Phosphorous acid | 0.1 g |
| Water | 5.0 g |
| Solvent (shown in Table 1) | 100 g |

The diazo resin (1) used herein was prepared by adding an aqueous sodium hexafluorophosphate solution to a solution of a condensate of p-diazodiphenylamine and paraformaldehyde in an aqueous sulfate solution to form a precipitate and drying the precipitate.

The copolymer (1) was water-insoluble, an aqueous alkali-soluble film-forming copolymer of p-hydroxyphenyl methacrylamide 2-hydroxyethyl methacrylate acrylonitrile methyl methacrylate methacrylic acid (weight ratio: 10/20/25/35/10, average molecular weight: 60,000, acid value: 65).

The photosensitive lithographic plate was image-exposed, developed with DN-3C (an aqueous alkali solution developer of Fuji Photo Film Co., Ltd.) diluted with water in a ratio of 1:1 for 60 sec., and washed with water, and a desensitizing gum was applied thereto. The printing plate thus produced was fixed to printing machine and its printing durability was examined.

The printing durabilities of the lithographic plates produced by using various solvents are shown in Table 1.

It is apparent from Table 1 that the photosensitive lithographic plates produced by the process of the present invention had excellent printing durability.

TABLE 1

| | Solvent composition and printing durability | | |
|---|---|---|---|
| Example | Solvents in coating solution | (Amount) | Printing durability |
| No. 1 | 1-methoxy-2-propanol<br>methyl lactate<br>methanol | 50%<br>10%<br>40% | 50,000 sheets |
| No. 2 | 1-methoxy-2-propanol<br>methyl lactate<br>ethylene chloride | 50%<br>10%<br>40% | 50,000 |
| No. 3 | 1-methoxy-2-propanol<br>methyl lactate<br>tetrahydrofuran | 50%<br>10%<br>40% | 55,000 |
| No. 4 | 1-methoxy-2-propanol<br>methyl lactate<br>methyl ethyl ketone | 50%<br>10%<br>40% | 55,000 |
| No. 5 | 1-methoxy-2-propanol<br>methyl lactate<br>ethyl acetate | 40%<br>20%<br>40% | 50,000 |
| No. 6 | 1-methoxy-2-propanol<br>methyl lactate<br>methanol<br>methyl ethyl ketone | 50%<br>10%<br>20%<br>20% | 50,000 |
| No. 7 | 1-methoxy-2-propanol<br>methyl lactate<br>ethylene glycol dimethyl ether | 50%<br>10%<br>40% | 55,000 |
| Comp. Ex. No. 1 | 1-methoxy-2-propanol<br>methanol | 60%<br>40% | 40,000 sheets |
| Comp. Ex. No. 2 | 1-methoxy-2-propanol<br>ethylene chloride | 60%<br>40% | 40,000 |
| Comp. Ex. No. 3 | 1-methoxy-2-propanol<br>tetrahydrofuran | 60%<br>40% | 40,000 |
| Comp. Ex. No. 4 | 1-methoxy-2-propanol<br>methyl ethyl ketone | 60%<br>40% | 40,000 |
| Comp. Ex. | 1-methoxy-2-propanol | 60% | 40,000 |

TABLE 1-continued

| | Solvent composition and printing durability | | |
|---|---|---|---|
| Example | Solvents in coating solution | (Amount) | Printing durability |
| No. 5 | ethyl acetate | 40% | |

EXAMPLE 2

The following photosensitive composition solution (2) was applied to the aluminum substrate treated in the same manner as in Example 1 by the same coating method as in Example 1 and then dried.

| Solution of photosensitive composition (2) | |
|---|---|
| Copolymer (2) | 5.0 g |
| Diazo resin (2) | 0.5 g |
| Victoria Pure Blue BOH | 0.15 g |
| Sodium t-butylnaphthalenesulfonate | 0.15 g |
| Phosphorous acid | 0.1 g |
| Solvent (shown in Table 2) | 100 g |

The copolymer (2) used herein was a 2-hydroxyethyl methacrylate/acrylonitrile/ethyl methacrylate/methacrylic acid copolymer (weight ratio: 45/15/35/5, average molecular weight: 80,000, acid value: 33) and the diazo resin (2) was dodecylbenzenesulfonate of a condensate of p-diazodiphenylamine and formaldehyde.

After conducting the exposure, developing treatment and printing in the same manner as in Example 1, the printing durabilities of the lithographic plates were examined to obtain the results shown in Table 2.

TABLE 2

| | Solvent composition and printing durability | | |
|---|---|---|---|
| Example | Solvents in coating solution | (Amount) | Printing durability |
| No. 8 | 1-methoxy-2-propanol<br>methyl lactate<br>methanol | 50%<br>10%<br>40% | 55,000 sheets |
| No. 9 | 1-methoxy-2-propanol<br>methyl lactate<br>ethylene chloride | 50%<br>10%<br>40% | 55,000 |
| No. 10 | 1-methoxy-2-propanol<br>methyl lactate<br>tetrahydrofuran | 50%<br>10%<br>40% | 60,000 |
| No. 11 | 1-methoxy-2-propanol<br>methyl lactate<br>methyl ethyl ketone | 50%<br>10%<br>40% | 60,000 |
| No. 12 | 1-methoxy-2-propanol<br>methyl lactate<br>ethyl acetate | 40%<br>20%<br>40% | 55,000 |
| No. 13 | 1-methoxy-2-propanol<br>methyl lactate<br>methanol<br>methyl ethyl ketone | 50%<br>10%<br>20%<br>20% | 55,000 |
| No. 14 | 1-methoxy-2-propanol<br>methyl lactate<br>ethylene glycol dimethyl ether | 50%<br>10%<br>40% | 60,000 |
| Comp. Ex. No. 6 | 1-methoxy-2-propanol<br>methanol | 60%<br>40% | 45,000 sheets |
| Comp. Ex No. 7 | 1-methoxy-2-propanol<br>ethylene chloride | 60%<br>40% | 45,000 |
| Comp. Ex. No. 8 | 1-methoxy-2-propanol<br>tetrahydrofuran | 60%<br>40% | 45,000 |
| Comp. Ex. No. 9 | 1-methoxy-2-propanol<br>methyl ethyl ketone | 60%<br>40% | 45,000 |
| Comp. Ex. No. 10 | 1-methoxy-2-propanol<br>ethyl acetate | 60%<br>40% | 45,000 |

EXAMPLE 3

The following photosensitive composition solution (3) was applied to an aluminum substrate treated in the same manner as in Example 1 by the same coating method as in Example 1, and then dried.

| Solution of photosensitive composition (3) | |
| --- | --- |
| Copolymer (3) | 3.0 g |
| Diazo resin (3) | 1.4 g |
| Victoria Pure Blue BOH | 0.1 g |
| p-Toluenesulfonic acid hydrate | 0.2 g |
| Solvent (shown in Table 3) | 100 g |

The copolymer (3) used herein was a polyvinyl butyral comprising 69 to 71% of polyvinyl butyral units, 1% of polyvinyl oxide units and 24 to 27% of polyvinyl alcohol units, and a 5% solution thereof in butanol had a viscosity of 2.0 to 3.0 cP at 20° C. The diazo resin (3) was a copolycondensate prepared from 1 mol of 3-methoxydiphenylamine-4-diazonium sulfate and 1 mol of 4,4'-bismethoxymethyldiphenyl ether (the copolycondensate being prepared in an 85% aqueous phosphoric acid solution and precipitated in the form of its mesitylenesulfonate).

The photosensitive lithographic plate was exposed to form an image and then treated with a developer of the following composition:

| | |
| --- | --- |
| Water | 500 g |
| Isopropanol | 150 g |
| n-Propanol | 200 g |
| n-Propyl acetate | 125 g |
| Polyacrylic acid | 15 g |
| Acetic acid | 15 g |

The printing durabilities of the lithographic plates produced by using various solvents are shown in Table 3.

TABLE 3

Solvent composition and printing durability

| Example | Solvents in coating solution | (Amount) | Printing durability |
| --- | --- | --- | --- |
| No. 15 | 1-methoxy-2-propanol | 50% | 60,000 sheets |
| | methyl lactate | 10% | |
| | methanol | 40% | |
| No. 16 | 1-methoxy-2-propanol | 50% | 60,000 |
| | methyl lactate | 10% | |
| | methyl ethyl ketone | 40% | |
| No. 17 | 1-methoxy-2-propanol | 40% | 60,000 |
| | methyl lactate | 20% | |
| | ethyl acetate | 40% | |
| No. 18 | 1-methoxy-2-propanol | 50% | 60,000 |
| | methyl lactate | 10% | |
| | methanol | 20% | |
| | methyl ethyl ketone | 20% | |
| Comp. Ex. No. 11 | 1-methoxy-2-propanol | 60% | 50,000 |
| | methanol | 40% | |
| Comp. Ex. No. 12 | 1-methoxy-2-propanol | 60% | 50,000 |
| | methyl ethyl ketone | 40% | |
| Comp. Ex. No. 13 | 1-methoxy-2-propanol | 60% | 50,000 |
| | ethyl acetate | 40% | |
| Comp. Ex. No. 14 | 1-methoxy-2-propanol | 60% | 50,000 |
| | methanol | 20% | |
| | methyl ethyl ketone | 20% | |

What is claimed is:

1. A process for producing a photosensitive lithographic plate, which comprises coating onto a substrate having a hydrophilic surface a solution of a negative working photosensitive composition wherein the solid content thereof is from 1 to 50 wt.% based on the solution of the photosensitive composition containing 3 to 30 wt.% of a photosensitive diazo resin and 70 to 97 wt.% of a linear organic polymer based on total weight thereof dissolved in a solvent mixture comprising:
   (a) 10 to 90 wt.% of 1-methoxy-2-propanol,
   (b) 5 to 70 wt.% of an amino group-free polar solvent having a boiling point under 1 atm of 50 to 100° C. and a dielectric constant at 20° C. of at least 5.5, and
   (c) 5 to 30 wt.% of methyl lactate, the amount of components (a), (b), and (c) being based on the total solvent mixture,
and drying the coated solution.

2. A process of claim 1, wherein the amino group-free polar solvent is selected from a group consisting of halogenated hydrocarbons, aliphatic alcohols, ethers, ketones and esters.

3. A process of claim 1, wherein the solvent mixture further contains a higher-boiling-point solvent having a boiling point higher than that of methyl lactate in an amount of less than 2 wt.%.

4. A process of claim 1, wherein the amino group-free polar solvent is at least one selected from the group consisting of 1,2-dichloroethane, 1,1-dichloroethane, 1,1,1-trichloroethane, cis-1,2-dichloroethylene, 1,2-dichloropropane, butyl chloride, chlorobromomethane, methanol, ethanol, n-propanol, isopropanol, sec-butyl alcohol, tert-butyl alcohol, tert-butyl alcohol, tetrahydrofuran, tetrahydropyran, ethylene glycol dimethyl ether, acetone, methyl ethyl ketone, ethyl formate, propyl formate, isobutyl formate, methyl acetate, ethyl acetate, isopropyl acetate, methyl propionate and ethyl propionate.

5. A process of claim 4, wherein the amino group-free polar solvent is at least one selected from the group consisting of methanol, ethylene chloride, tetrahydrofuran, methyl ethyl ketone, ethyl acetate, and ethylene glycol dimethyl ether.

6. A process of claim 1, wherein the photosensitive composition is applied to the substrate in an amount of 0.3 to 5 g/m² in terms of solids.

7. A process of claim 1, wherein the substrate is dried at 50° to 120° C.

8. A process of claim 1, wherein the linear organic polymer is a copolymer of (a) 2-hydroxyethyl acrylate or hydroxyethyl methacrylate, (b) acrylonitrile or methacrylonitrile, (c) acrylic acid or methacrylic acid, and (d) an other copolymerizable monomer or a copolymer of (i) a monomer having a terminal aromatic hydroxyl group, (ii) acrylic acid or methacrylic acid, and (iii) another copolymerizable monomer.

9. A process of claim 1, wherein the diazo resin is a condensate of an aromatic diazonium salt and an active carbonylcontaining compound.

10. A process of claim 1, wherein the diazo resin is selected from the group consisting of hexafluorophosphates, tetrafluoroborates and phosphates, sulfonates of a condensate of p-diazodiphenylamine and formaldehyde, and mesitylenesulfonate of a condensate between 3-methoxy-4-diazodiphenylamine and 4,4'-bismethoxymethyldiphenyl ether.

11. A process of claim 1, wherein the photosensitive composition further contains a fluorine-containing surfactant in a sufficient amount to improve a coating properties.

12. A process of claim 1, wherein the solvent mixture further contains (d) a higher-boiling solvent selected from the group consisting of dimethyl sulfoxide, diethylene glycol monomethyl ether, diethylene glycol monomethyl ether acetate, diethylene glycol monoethyl ether, diethylene glycol dimethyl ether, diethylene glycol triethylene glycol monomethyl ether, triethylene glycol, ethylene glycol monophenyl ether, trimethyl phosphate, triethyl phosphate, ethylene carbonate, τ-butyrolactone, τ-valerolactone, diacetone alcohol, ethyl acetoacetate and tetrahydrofurfuryl alcohol, in an amount of from 0.5 to 1.5 wt.% based on the total weight of the solvents.

13. A process of claim 1, wherein the substrate is an aluminum plate.

14. A process of claim 1, wherein the linear organic polymer is a copolymer having free hydroxy and free acid groups.

* * * * *